(12) United States Patent
Horst et al.

(10) Patent No.: US 7,513,793 B2
(45) Date of Patent: Apr. 7, 2009

(54) SURFACE MOUNT POKE IN CONNECTOR

(75) Inventors: Sheldon Lynn Horst, Columbia, PA (US); Christopher G. Daily, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/615,235

(22) Filed: Dec. 22, 2006

(65) Prior Publication Data
US 2008/0153344 A1    Jun. 26, 2008

(51) Int. Cl.
*H01R 11/20* (2006.01)
(52) U.S. Cl. ...................................... 439/427
(58) Field of Classification Search ................ 439/427, 439/607, 460, 535, 358, 352
See application file for complete search history.

(56) References Cited

U.S. PATENT DOCUMENTS

| | | | |
|---|---|---|---|
| 4,223,971 A | 9/1980 | Dola et al. | |
| 4,310,211 A * | 1/1982 | Bunnell et al. | 439/358 |
| 4,357,069 A | 11/1982 | Milora | |
| 4,391,484 A | 7/1983 | Foederer | |
| 4,460,232 A * | 7/1984 | Sotolongo | 439/535 |
| 4,820,192 A | 4/1989 | Denkmann et al. | |
| 4,865,563 A | 9/1989 | Ney et al. | |
| 4,964,811 A | 10/1990 | Hayes, Sr. et al. | |
| 5,091,826 A | 2/1992 | Arnett et al. | |
| 5,190,470 A | 3/1993 | Soes et al. | |
| 5,203,717 A * | 4/1993 | Beck et al. | 439/460 |
| 5,241,134 A | 8/1993 | Yoo | |
| 5,478,248 A | 12/1995 | Mitra et al. | |
| 5,547,391 A | 8/1996 | Benes et al. | |
| 5,713,767 A | 2/1998 | Hanson et al. | |
| 5,877,673 A | 3/1999 | Kotani et al. | |
| 5,890,924 A | 4/1999 | Endo et al. | |
| 6,050,845 A | 4/2000 | Smalley, Jr. et al. | |
| 6,080,006 A | 6/2000 | Broder | |
| 6,093,053 A | 7/2000 | Horioka et al. | |
| 6,210,204 B1 | 4/2001 | Ko et al. | |
| 6,741,453 B1 | 5/2004 | Aleardi et al. | |
| 6,755,678 B2 | 6/2004 | Ward et al. | |
| 2002/0055295 A1 | 5/2002 | Itai et al. | |
| 2004/0253974 A1 | 12/2004 | Pei et al. | |
| 2006/0189174 A1 | 8/2006 | Fabian et al. | |

FOREIGN PATENT DOCUMENTS

| | | |
|---|---|---|
| DE | 9312961 | 11/1993 |
| DE | 9411808 | 11/1994 |
| DE | 10 2004 049575 | 4/2006 |
| EP | 0413156 | 2/1991 |
| EP | 0489549 | 6/1992 |
| EP | 0959529 | 11/1999 |
| GB | 2130027 | 5/1984 |

* cited by examiner

*Primary Examiner*—Jean F Duverne

(57) ABSTRACT

A surface mount poke in connector is disclosed for mounting upon a surface of a printed circuit board, and is particularly applicable for printed circuit boards supporting LEDs. The connector has a securing means for engaging an inserted wire lead without the use of solder.

17 Claims, 3 Drawing Sheets

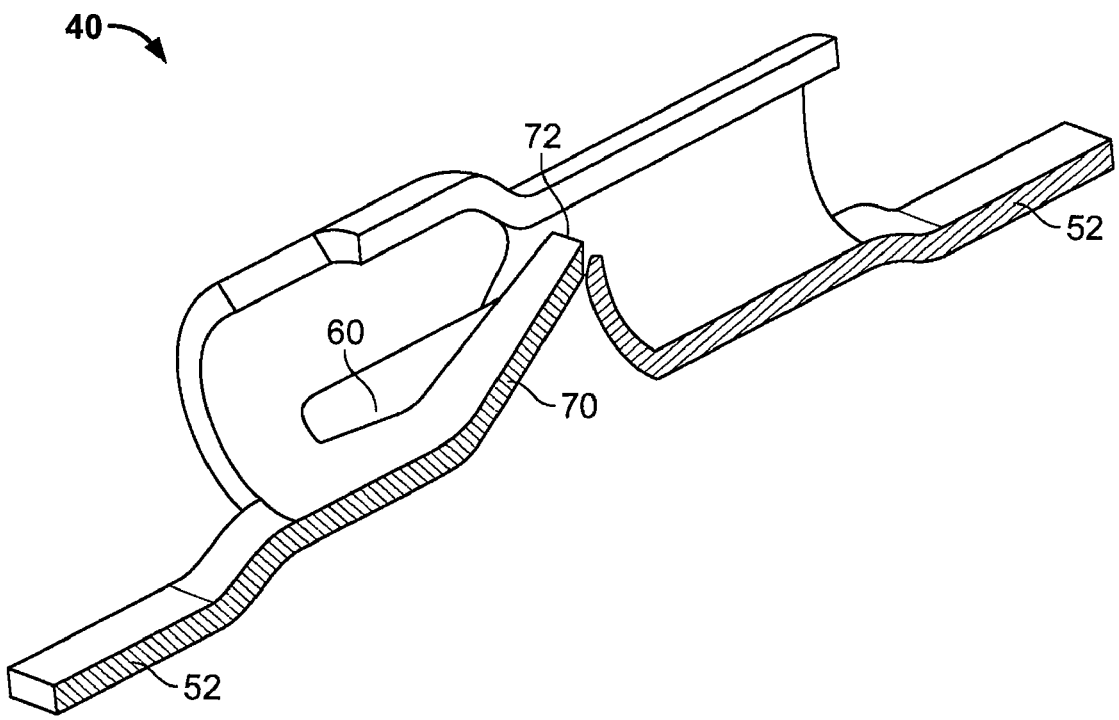
FIG. 3
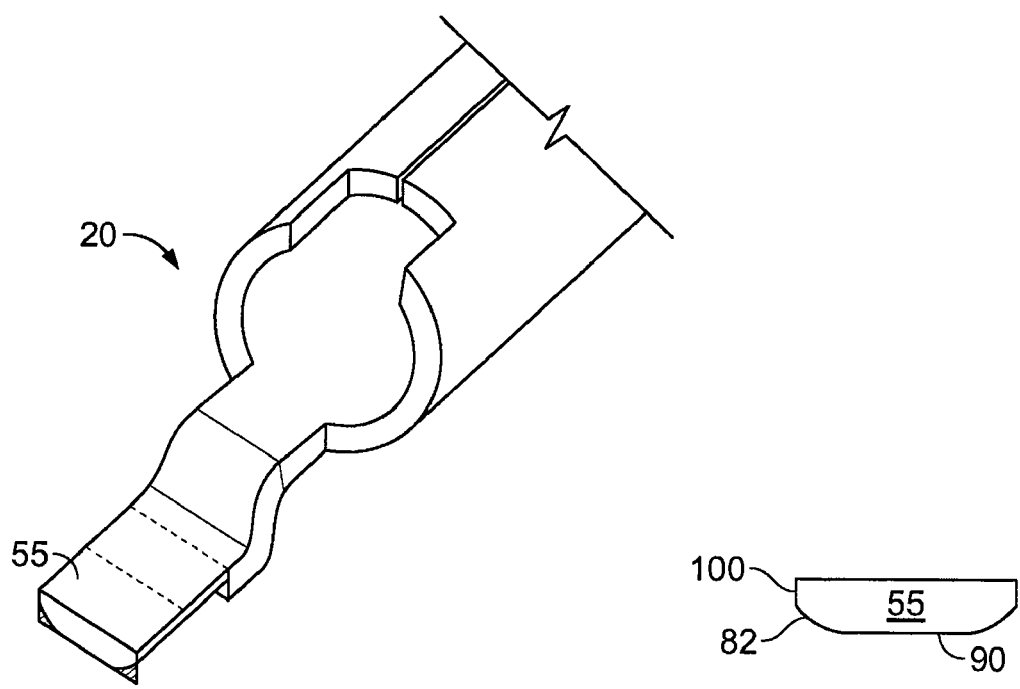
FIG. 4
FIG. 5

SURFACE MOUNT POKE IN CONNECTOR

CROSS-REFERENCE TO RELATED APPLICATIONS

This application is related to co-pending application Ser. No. 11/063,065, filed Feb. 22, 2005 entitled "LOW PROFILE SURFACE MOUNT CONNECTOR" assigned to the assignee of the present invention and which is incorporated herein by reference in its entirety.

FIELD OF THE INVENTION

The present invention is directed to a low profile surface mount electrical connector (SMEC) for connecting wire leads to an electrical device constructed using surface mount technology (SMT). The electrical device may be a printed circuit board (PCB), but is not limited thereto. The PCB may contain light emitting diodes (LEDs). The invention is particularly well suited for connecting multiple PCBs in series.

BACKGROUND OF THE INVENTION

Electrical devices are often attached to printed circuit boards (PCBs) by soldering terminals of the electrical device to a surface of the PCB. Surface Mount Technology (SMT) is a particular method of soldering electrical terminals to a PCB. SMT has been developed to affix electrical devices upon PCBs in an automated manner, but the devices may also be placed manually. SMT has reduced cost, improved reliability, and reduced the overall physical size of the PCB in many applications. SMT allows for mounting electrical devices on both sides of a PCB, which was not possible using through hole mounting technology.

SMT is a method for constructing electronic circuits in which the components are mounted directly onto the surface of a PCB or other suitable component surface. SMT is a proven technology for creating electronic assemblies with higher packaging density when compared with comparable through-hole technology methods of PCB assembly. The components are typically mounted on the board by an automated method such as robot assisted assembly line. Electrical points of contact between the components and the board may be treated with solder paste. Assembled PCBs may then be treated in a high temperature oven at temperatures of up to about 265° C. or higher to reflow the solder. The oven may be operated with an air atmosphere or under an inert atmosphere such as nitrogen.

Electronic devices so made are called surface-mount devices (SMDs). SMT has largely replaced the previous construction method of fitting components with wire leads into holes in the circuit board, which is called through-hole technology. An SMT component is usually smaller than its leaded counterpart because it has no leads or smaller leads. It may have short pins or leads of various styles, flat contacts, a matrix of balls, or other terminations on the body of the component to assist with fixing the component to the board and/or establish an electrical connection between the board and the component.

PCBs supporting light emitting diodes (LEDs) may be used to form light displays. Often, multiple LED lighting PCBs are coupled in series by two or more wires to form a string of PCBs. The string of PCBs provides for a flexible light source able to adapt to the contours of large letters used in signage. Current practice is to connect the wires to the PCBs by soldering the leads of the wires to the top surface of the PCB. The step of soldering the wire leads to the boards is time consuming and costly.

Therefore, there is an unmet need to provide a connector for securely connecting a wire lead to a PCB that is capable of being attached to the PCB by a simple, reliable and cost effective process such as a SMT automated process. The connector must approach the small physical size envelope of the wires to be soldered so as not to shadow any neighboring components in a PCB supporting LEDs.

SUMMARY OF THE INVENTION

This invention provides for a low profile surface mounted electrical connector (SMEC) for connecting a wire lead to a printed circuit board (PCB) or other suitable component surface. The low profile of the connector reduces shadowing by the connector when mounted on a PCB supporting LEDs. The SMEC is attached to the PCB by surface mount technology (SMT), a standardized automated process for placing and attaching electrical and electronic components to PCBs. Attachment may be by soldering, using a conductive adhesive, or other similar method.

The SMEC is formed of a housing with an opening that allows for a stripped wire lead to be inserted and secured. Inside the opening in the housing is a contact to accept and secure the wire lead firmly in place, and thus establish an electrical path from the wire lead to the PCB. The securing mechanism may be in the form of a barrel, spring or other tensioning mechanism that provides for a strong, reliable electrical connection. The SMEC replaces a solder joint to connect wire leads to PCBs.

The SMEC is formed of a housing and a contact. The SMEC may be attached to the PCB by conventional SMT techniques. The SMEC may be attached to the PCB by the soldering the contact to the PCB surface. Alternatively, the SMEC may be attached to the surface of the PCB by the use of a conductive adhesive or solder paste or similar attachment method.

In a first embodiment, the SMEC is attached to the PCB by first attaching the housing to the contact to form the SMEC, and then attaching the SMEC to a surface of the PCB by known SMT techniques. The contact has attachment points for connection to the PCB surface. The attachment points may be attached to the PCB surface by soldering, using a conductive adhesive or solder paste, or by other known SMT techniques.

In a second embodiment, the SMEC is attached to the PCB by first attaching the contact to the PCB by any known SMT technique including soldering. The contact is provided with attachment points to assist in the mounting to the PCB. Then the housing is attached to the contact. The housing may be attached to the contact by fabricating the housing with a structure that frictionally fits, or snaps into place over the contact. The housing may be manually attached to the contact or may be placed by other SMT techniques.

In an alternative embodiment, the housing is omitted from the SMEC and the contact is left uncovered upon the PCB surface. This alternative embodiment may be used to reduce the cost of the connection.

The housing may be formed of a high temperature material that is lightweight and high strength, and able to operate in a high temperature environment such as along the surface of a PCB that supports LEDs. The housing may be formed of a high temperature liquid crystalline polymer (LCP) such as Zenite 6330® by E.I. du Pont de Nemours and Company of Wilmington, Del. or a high temperature nylon such as Stanyl 46 HF® by DSM Engineering Plastics North America, Inc., based in Reading, Pa., or any other known industry acceptable non-conductive high temperature resin. The housing is designed with a low profile and small footprint so that it may be placed upon a PCB supporting lighting LEDs without shadowing or blocking the light emissions of the LEDs. The housing at least partially covers the contact.

The contact may be cylindrical, square, rectangular or other geometry. The contact may be formed in part or in whole of a conductive material so as to provide an electrical connection from the wire lead to the PCB. For example, the contact may be formed of a phosphor bronze metal with a tin plating or other known industry acceptable conductive metal and plating. The contact may be formed by first forming a predetermined shape from a conductive sheet and then forming the predetermined shape into a cylindrical, rectangular, square or other geometry with extended attachment points. The first forming may be stamping. The conductive sheet may be formed of a phosphor bronze metal sheet with a tin plating.

The first step in forming the contact is to stamp, cut or by other similar shaping methods form a predetermined shape from stock material. Then, a forming of the predetermined shape into the contact with extended attachment points may be performed by any material shaping method such as rolling and working to form the desired shape. The desired shape may be cylindrical, rectangular, square of other geometry. A combination of different shaping techniques may be used to complete the contact design. The extended attachment points of the contact may be provided with an edge bevel to assist in solder reflow during attachment to the PCB. Beveling of the attachment points is most important when pre-plated stock material is used, but the barrel may be plated at any point during the contact forming process.

The contact is formed with an engaging mechanism such as a slot and lance, pin or other similar shape for firmly securing the wire lead within the barrel. The slot and lance may be formed into the contact during the forming of the predetermined shape. The lance may be shaped so as to provide for an edge to engage the wire lead within the barrel. The slot and lance may be placed at any radial location on the contact except for where forming seams prohibit the placement. The slot and lance are preferably placed on the side or bottom of the contact. Superior performance has been observed with the slot and lance placed on the bottom since the PCB acts as a stop to lance deformation.

Further aspects of the method and system are disclosed herein. The features as discussed above, as well as other features and advantages of the present invention will be appreciated and understood by those skilled in the art from the following detailed description and drawings.

BRIEF DESCRIPTION OF THE DRAWINGS

FIG. 3 illustrates a sectional view of a contact.

FIG. 4 illustrates a detailed view of an alternative embodiment of an attachment point of a contact.

FIG. 5 illustrates a sectional view of the alternative embodiment of an attachment point of a contact.

DETAILED DESCRIPTION OF THE INVENTION

The present invention now will be described more fully hereinafter with reference to the accompanying drawing, in which a preferred embodiment of the invention is shown. This invention may, however, be embodied in many different forms and should not be construed as limited to the embodiments set forth herein; rather, these embodiments are provided so that this disclosure will be thorough and complete and will fully convey the scope of the invention to those skilled in the art.

Figure 1:
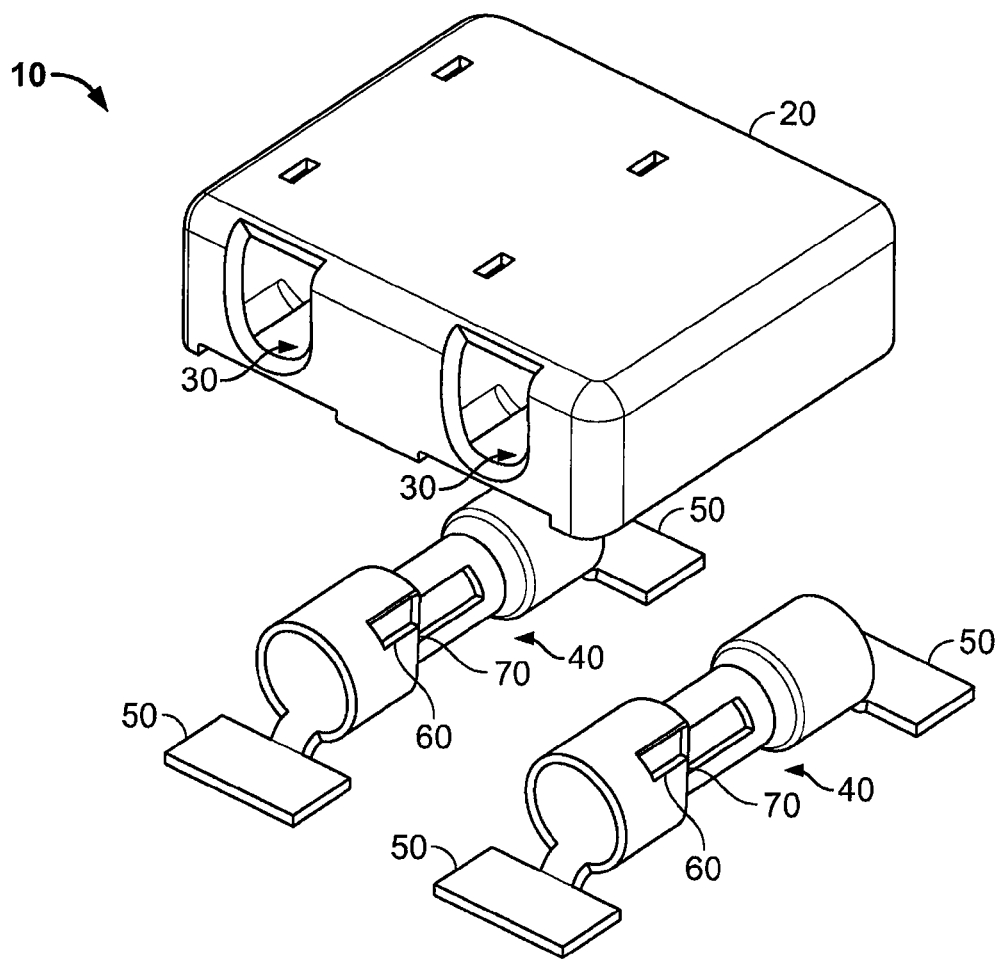
FIG. 1 illustrates an arrangement of an embodiment of the surface mounted electrical connector.

Referring to FIG. 1, an embodiment of the surface mounted electrical connector (SMEC) 10 is depicted. A SMEC 10 was formed of a housing 20 with at least one opening 30 and at least one contact 40. The housing 20 was formed of Zenite 6330®, a high temperature liquid crystalline polyester by E.I. du Pont de Nemours and Company of Wilmington, Del. The heat resistance of the housing allows it to be attached at the temperatures used to reflow solder the connector to the PCB surface.

The housing may be formed of a high temperature liquid crystalline polymer (LCP) such as Zenite 6330® or a high temperature nylon such as Stanyl 46 HF® or any other known industry acceptable non-conductive high temperature resin.

The SMEC 10 allows for the electrical connection of wire leads to the PCB without having to solder the wire leads to the PCB. The housing 20 was designed with a low profile and small footprint so that it could be placed upon a PCB supporting lighting LEDs without shadowing or blocking the light emissions of the LEDs.

The housing 20 contained at least one opening 30 that was initially formed into the housing 20. The housing 20 was formed by injection molding, and the opening 20 was formed during this step. The opening 30 may be formed after the initial forming of the housing 20. The housing 20 was designed to allow the contact 40 to be frictionally fit and retained by the housing 20 by a snap in feature.

The contact 40 was formed with attachment points 50 to allow the contact 40 to be joined to a PCB by conventional SMT methods such as soldering. The contact 40 was formed with a slot 60 and a lance 70 to secure a wire lead upon insertion into the contact 40.

Figure 2:
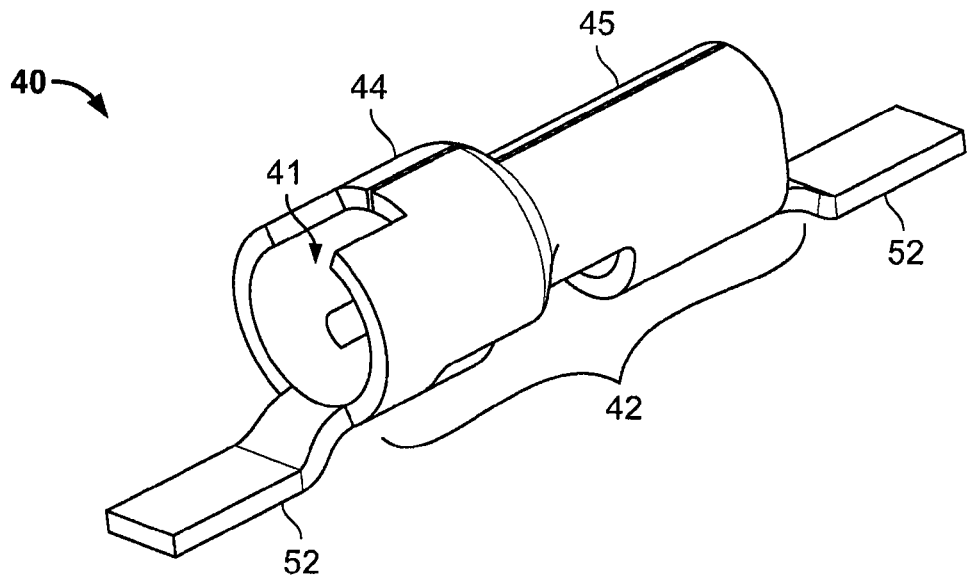
FIG. 2 illustrates a detailed view of a contact.

FIG. 2 shows a contact 40 with an attachment point 52 with a different geometry than attachment point 50 of FIG. 1. The shape of the attachment point 52 may vary depending upon the surface area desired to be in contact with the PCB surface.

The contact 40 may be attached to a PCB by soldering the attachment point 50 to the PCB surface. The housing 20 may then be attached to the contact 40 to form the SMEC 10. Alternatively, the contact 40 may be attached to the housing 20 to form the SMEC 10, and the SMEC 10 may then be attached to the PCB at the attachment points 50 by a conventional SMT method such as soldering.

As an alternative method of attachment, the attachment points 50 may be further formed to direct the attachment points 50 down 90 degrees so as to allow the attachment points to be inserted into through holes formed in a PCB surface.

FIG. 3 illustrates a more detailed view of an embodiment of the contact 40 with a slot 60 and a lance 70 formed on the bottom side of the contact 40. As shown in FIG. 3, the lance 70 is slightly depressed into the contact 40 so as to engage a wire lead when inserted into the contact 40. The contact 40 was formed by first stamping out a flat pattern blank from a tin plated phosphor bronze sheet. The sheet was a phosphor bronze metal of about 320 microns thick with a tin plating of about 3.0 to about 4.0 microns. It should be noted that the invention is not limited to this sheet or plating thickness, and that thinner or thicker sheet and plating may be selected as determined by the wire gauge and application. The flat pattern blank was then partially rolled and worked to form the contact 40 as shown in FIGS. 2 and 3 with a cylindrical portion 42 and an attachment point 52 for attaching the contact 40 to a substrate such as a PCB.

The cylindrical portion 42 was formed with an orientation notch 41 to assist in SMT processing by assisting in mating with the housing 20 to assist in polarization and alignment of the contact 40 attachment points 50, an expanded cylindrical portion 44 for receiving wire that has insulation thereupon, a wire lead portion 45 for receiving wire that has the insulation stripped therefrom. The contact 40 may be formed without the expanded cylindrical portion 44 to reduce the size of the contact 40. The wire lead portion 45 may be formed to accept standard wire strip lengths of between about 4 mm and about 7 mm. The wire lead may be a solid wire, a fused stranded wire, a stranded wire, a stranded twisted wire, or any other suitable wire configuration. As shown in more detail in FIG. 3, a lance 70 was provided with a sharp edge 72 to assist in securely engaging an inserted wire lead.

In an additional embodiment of the invention, the barrel may be used upon a PCB without a housing 20. This additional embodiment may reduce manufacturing and materials cost in uses where it is less important to shield the barrel from unwanted contact.

In an alternative embodiment of the attachment point as shown in FIGS. 4 and 5, the barrel 20 is provided with an alternative attachment point 55. The attachment point 55 is shown with a beveled section 82 to assist in solder reflow during attachment to a PCB. As further illustrated in FIG. 5, the attachment point 55 is provided with a substantially horizontal bottom section 90 and a flat sidewall section 100. A beveled section 82 with a thickness of about 50 to about 70 percent of the total thickness of the attachment point 55 has provided improved solder reflow properties. The beveled section 82, which may be formed by hitting the edge of the attachment point 55 with a coining operation, the tin plating on the bottom surface is formed on an angle. The beveled section 82 allows for the solder to more easily wet the angled tin face, creating a fillet of solder that would not otherwise form.

Figure 6:
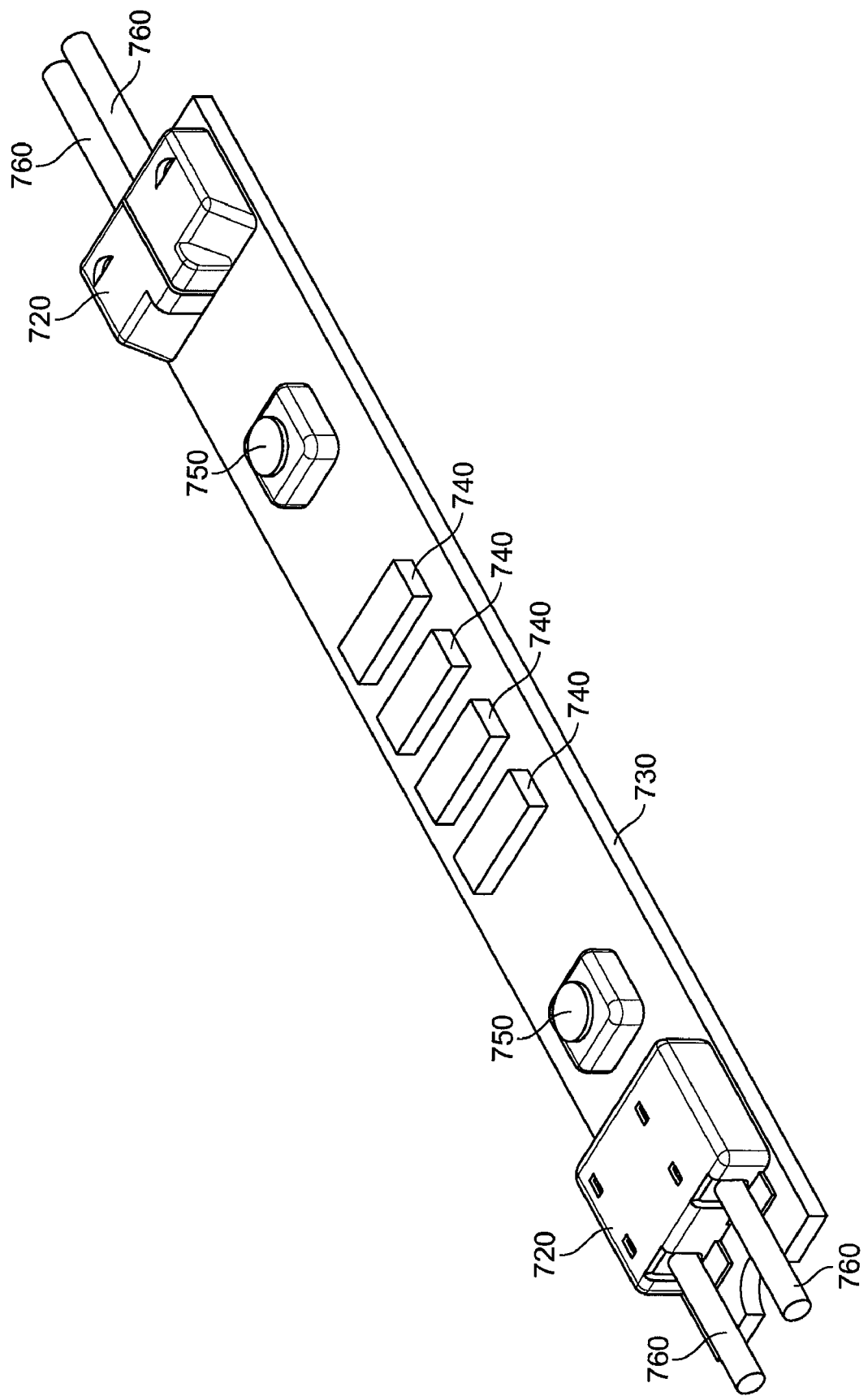
FIG. 6 illustrates an application of a surface mounted electrical connector upon a PCB containing LEDs.

FIG. 6 illustrates an application of an SMEC 720 as a system and method for attaching wires to a PCB 730. In this illustration, an SMEC 720 is attached to a surface of a PCB 730. The SMEC 720 may be attached to the PCB 730 by a conductive adhesive or solder. The PCB 730 also supports resistors 740 and LEDs 750. Wire leads 760 are attached to the PCB 730 via the SMEC 720. In this method, several PCBs supporting LEDs may be wired in series to form lighted signs.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A surface mount plug-in connector, comprising:
    a housing;
    an opening in the housing; and
    a contact attached to the housing;
    wherein the contact is at least partially covered by the housing; and
    wherein the contact comprises:
        a cylindrical portion for receiving a wire lead passed through the opening in the housing;
        a slot formed in the cylindrical portion;
        an engaging mechanism comprising a lance disposed in the slot formed in the cylindrical portion to engage the received wire lead; and
        an attachment point connected to the cylindrical portion for attaching the contact to a substrate;
        wherein the attachment point is configured to attach the contact to the substrate without contacting the cylindrical portion to the substrate.

2. The connector of claim 1, wherein the contact comprises a conductive material.

3. The connector of claim 2, wherein the conductive material comprises a tin coated bronze phosphor metal.

4. The connector of claim 1, wherein the attachment points are configured to join the contact to a printed circuit board.

5. The connector of claim 4, wherein the attachment points comprise a flat portion capable of being conductively secured to a printed circuit board.

6. The connector of claim 5, wherein the flat portion includes a beveled portion for improving solder reflow during soldering to a printed circuit board.

7. The connector of claim 4, wherein the attachment points are directed downward to allow the attachment points to be inserted into printed circuit board through-holes.

8. The connector of claim 1, wherein the housing comprises two or more securing mechanisms for attaching the housing to the contact by a snap fit.

9. The connector of claim 1, further comprising a printed circuit board connected to the contact.

10. The connector of claim 1, wherein the cylindrical portion comprises an expanded cylindrical portion.

11. The contact for securing a wire lead, comprising:
    a cylindrical portion for receiving a wire lead;
    a slot formed in the cylindrical portion;
    an engaging mechanism comprising a lance disposed in the slot formed in the cylindrical portion to engage the received wire lead; and
    an attachment point connected to the cylindrical portion for attaching the contact to a substrate;
    wherein the attachment point is configured to attach the contact to the substrate without contacting the cylindrical portion to the substrate.

12. The contact of claim 11, wherein the contact comprises a conductive material.

13. The contact of claim 12, wherein the conductive material comprises a tin coated bronze phosphor metal.

14. The contact of claim 11, wherein the lance has a sharp edge for engaging the wire lead.

15. The contact of claim 11, wherein the attachment point comprises a substantially horizontal bottom section and a beveled section.

16. The contact of claim 15, wherein the beveled section is about 50 to about 70 percent of the thickness of the attachment point.

17. The contact of claim 11, wherein the cylindrical portion comprises an expanded cylindrical portion.

* * * * *